United States Patent [19] [11] 3,980,367

Laserson et al. [45] Sept. 14, 1976

[54] ELECTRICAL CONNECTOR FOR JOINING CONDUCTORS ATTACHED TO PRINTED CIRCUIT BOARDS

[75] Inventors: Gregory L. Laserson, Scarsdale; James Iantorno, Mamaroneck, both of N.Y.

[73] Assignee: Sealectro Corporation, Mamaroneck, N.Y.

[22] Filed: Mar. 19, 1975

[21] Appl. No.: 559,720

[52] U.S. Cl. .......................... 339/17 R; 339/220 R; 339/275 B; 339/276 R

[51] Int. Cl.[2] .......................................... H05K 1/10

[58] Field of Search ............ 339/17 R, 17 C, 17 M, 339/17 LM, 17 LC, 220 R, 276 R, 276 A, 275 B

[56] References Cited

UNITED STATES PATENTS

| | | | |
|---|---|---|---|
| 2,194,458 | 3/1940 | Eckler | 339/17 R |
| 2,424,528 | 7/1947 | Wild | 339/220 R |
| 2,915,678 | 12/1959 | Frazier et al. | 339/17 C X |
| 2,937,358 | 5/1960 | Bulger | 339/17 E |
| 2,990,533 | 6/1961 | Hughes et al. | 339/220 R X |
| 3,428,934 | 2/1969 | Reider et al. | 339/17 R |
| 3,445,929 | 5/1969 | Wolf | 339/17 R |
| 3,686,625 | 8/1972 | Krehbiel et al. | 339/275 B |
| 3,702,455 | 11/1972 | Raynor et al. | 339/17 C |
| 3,866,998 | 2/1975 | Iantorno | 339/220 R |
| 3,880,486 | 4/1975 | Avakian | 339/17 M |

OTHER PUBLICATIONS

Electronic Fittings Corporation; "Curtac" Printed Circuit Board Contacts, Mar. 1972.

*Primary Examiner*—Joseph H. McGlynn
*Assistant Examiner*—Craig R. Feinberg
*Attorney, Agent, or Firm*—Anthony J. Casella

[57] ABSTRACT

A hollow closed end cylindrical metal conductor for connecting conductors attached to the surfaces of a plurality of printed circuit boards. One end of the cylindrical conductor is formed with an outwardly extending flange which limits against the top surface of the top circuit board. The other end of the cylindrical conductor is first formed in a cone, inserted into and through axial holes in all the boards, and is then forceably deformed to extend beyond the bottom edge of the hole in the bottom board. Molten solder is next applied to the array and the cylindrical conductor and all the adjoining ends of the conductors on the circuit boards are connected to each other. In an alternate embodiment, the electrical connector is provided with a knurled body portion for forming an interference fit with the conductors on the circuit boards.

11 Claims, 6 Drawing Figures

ELECTRICAL CONNECTOR FOR JOINING CONDUCTORS ATTACHED TO PRINTED CIRCUIT BOARDS

BACKGROUND OF THE INVENTION

Connecting means of various types have been used in the past to connect the conductors of one printed circuit board to another similar board in the same stack. Sometimes separate leads have been used, extending beyond the peripheries of the boards, and joined by an external connecting means. Other connectors have included conductors extending through holes in two circuit boards and soldered to the upper face of an upper board and also to the lower face of a lower board. There has been no satisfactory connecting means which connects the conductors of two or more circuit boards when the conductors are confined between adjacent surfaces of the boards.

The present invention uses a hollow cylindrical connector installed within axial holes in the circuit boards and surrounded by molten solder which seeps into the narrow cracks between boards and makes electrical contact with all adjoining board conductors.

One of the features of the invention is the ease with which the molten solder can be applied: either by dipping into a molten solder bath or by the application by a special soldering tool.

Another feature of the invention is the speed with which the connector can be installed. After placing in the holes in the printed circuit boards, a single blow of a hammer will flatten the lower portion of the connector to keep it in place.

SUMMARY

The invention comprises an electrical connector for joining electrical conductors attached to the surfaces of a plurality of printed circuit boards. The electrical conductor comprises a hollow closed end cylindrical conductor which is inserted into a hole formed in all of the boards. The cylindrical conductor is formed with a flange at one end for limiting against the top surface of the top board. The cylindrical conductor is also formed with a cone-shaped lower end which is adapted to spread evenly over a portion of the bottom board around the hole when hit by a hammer. A quantity of molten solder is applied to the cylindrical connector by dipping into a solder pot and the solder allowed to disperse, by capillary attraction, to the outside surfaces of the connector and to make electrical contact with all the adjoining conductors attached to the circuit boards.

The flange at one end of the cylindrical connector is preferably formed with a cone surface next to the top surface of the adjacent circuit board for providing an annular space for the positioning of solder.

Additional details of the invention will be disclosed in the following description, taken in connection with the accompanying drawings.

DESCRIPTION OF THE PREFERRED EMBODIMENTS

Figure 1:
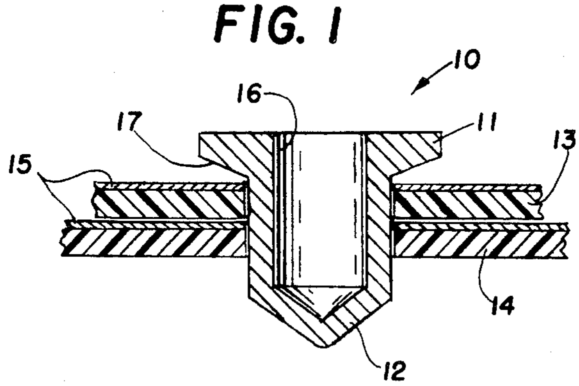
FIG. 1 is a cross sectional view of one form of the connector before the cone portion has been flattened.
Figure 2:
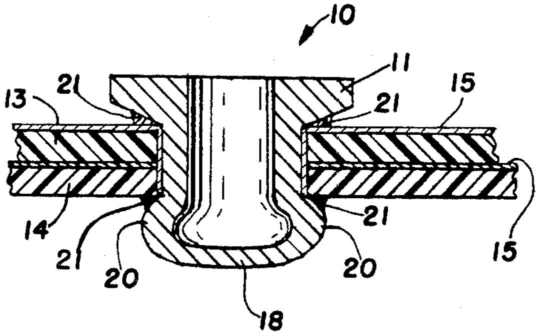
FIG. 2 is a cross sectional view of the fastener shown in FIG. 1 after the cone portion has been flattened and the solder has been applied.

Referring now to FIGS. 1 and 2, the connector comprises a hollow cylindrical body 10 having a retaining flange 11 at one end. The other end is formed with a cone shape 12 forming a solid angle of about 90°. The connector is placed in a hole formed in two or more circuit boards 13, 14 having flat conductive strips 15 attached to their surfaces. The connector 10 is for use with the well known form of circuit board where strips of copper or other conductive material are plated or otherwise attached to the surface of the boards. The connector is formed with a hollow portion 16 which extends down into the cone end 12 far enough to form a wall thickness substantially the same as the thickness of the cylindrical portion. The flange 11 may have top and bottom surfaces which are flat but the preferred form includes a lower surface 17 in the shape of a cone. This construction provides an annular space having boundaries defining an angle of at least 30°.

When this form of connector is applied to two circuit boards, as shown, the connector is pushed into the holes in the boards and then, with a brace on the flange 11, the cone portion 12 is deformed by striking it a sharp blow with a hammer or other blunt instrument. Alternatively, the flattening of the cone portion 12 may be accomplished in a press at any convenient rate. Furthermore, since the cone deformation requires only a flat plate as an anvil a multiplicity of terminals can be installed and swaged simultaneously in contradiction to riveted terminals which must be installed one at a time.

When installed the flattened end surface 18 and a distorted rim 20 which overlies the edges of the bottom circuit board 14 forces the two boards into contact with each other. The assembly is now dipped into a solder pot, where molten solder is maintained at an elevated temperature, and solder 21 is allowed to seep into the small voids and cracks around the cylindrical connector, being held in these spaces by capillary attraction and effectively connecting together all the conductive strips on both boards which adjoin the hole.

Figure 3:
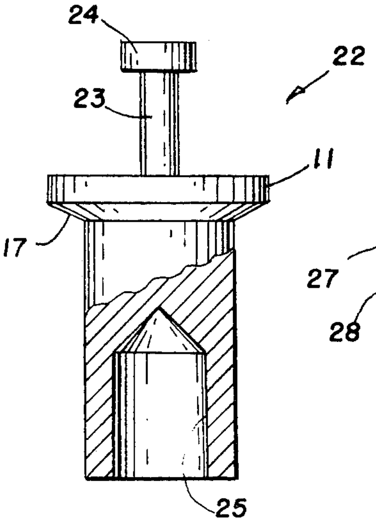
FIG. 3 is a side view, with parts in section, of an alternate form of the connector formed with a shaft for connection to an external circuit.
Figure 4:
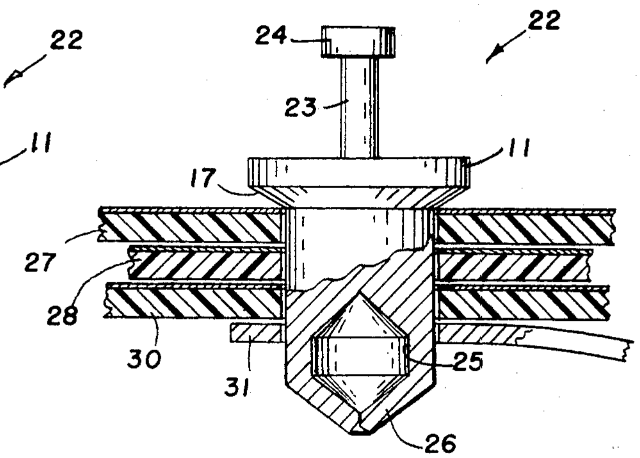
FIG. 4 is a side view, with parts in section, of the connector shown in FIG. 3 with its end formed as a cone and assembled with three circuit boards and an additional metal conductor.
Figure 5:
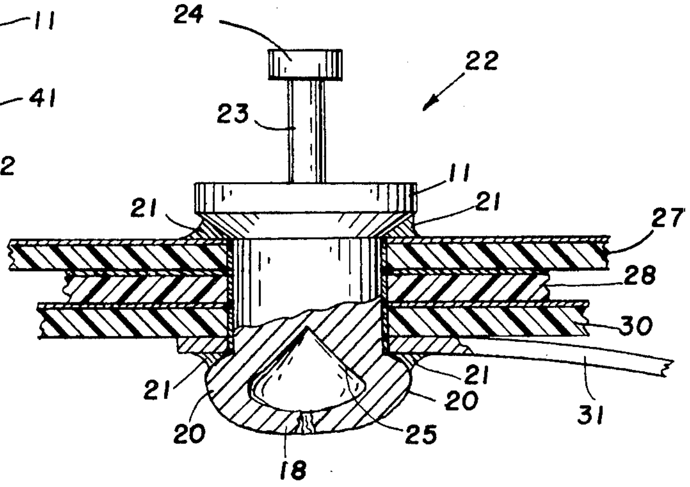
FIG. 5 is a side view, with parts in section, of the connector assembly shown in FIG. 4 with the cone end flattened and solder added.

Referring now to FIGS. 3, 4 and 5, another form of the preferred connector is shown, this connector 22 formed with an axial shaft 23 terminated by a head 24. Since the hollow portion 25 cannot be formed from the upper end because of the shaft 23, a hole 25 is bored from the lower end resulting in the connector shown in FIG. 3. The usual flange 11 and cone surface 17 are supplied as shown in FIGS. 1 and 2.

A cone 26 is now formed on the lower end of the connector 22 by swaging, by a punch press tool, or by a trio of revolving wheels secured to a central shaft powered by a drill press. These operations are well known in the art and, after the cone 26 is formed, the connector resembles the article 22 shown in FIG. 4.

The connector 22 is next assembled with a plurality of circuit boards, in this case three 27, 28, and 30, and in addition a connector strap 31 is added to the cone end 26. The cone end is next flattened by a sharp hammer blow and the assembly is dipped into molten solder. The result is shown in FIG. 5 where the distorted rim 20 acts to hold the boards and strap together and the solder 21 provides electrical connection between the shaft 23, the strap 31, and all the conductive strips adjoining the hole edges on the circuit boards. The result is a connecting means which provides electrical connection to all desired conductors and also secures the connected conductors in an array which cannot shake loose, even if subjected to severe vibration.

Figure 6:
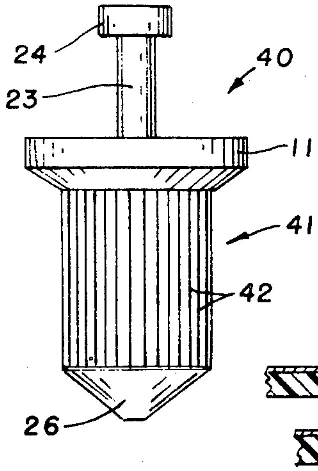
FIG. 6 is a side view of a second alternate embodiment of the subject invention.

Referring now to FIG. 6, still another embodiment of the subject electrical connector 40 is shown as including a hollow cylindrical body 41, the surface of which is knurled, as at 42. When assembled with printed circuit boards, the knurled body portion 42 has an interference fit in the holes of the boards, thus providing electrical contact to the intermediate layers of the multi-layered board. It is not essential that molten solder be used with the subject electrical connector 40 as illustrated in FIG. 4. In the case of multiple circuit board the interference fit of knurl 22 provides electrical contact to the intermediate layers.

In summary, the subject invention provides a new and improved electrical connector for joining conductors attached to printed circuit boards. Although the application has been described with reference to printed circuit boards of the rigid type, it is readily appreciated that the subject electrical connector may also be employed in printed circuits having flexible substrates. When employing flexible printed circuits, the soldered connection as shown with reference to the embodiment of FIGS. 1 through 5 may not be the most suitable connection, therefore, a knurled connector of the type described in FIG. 6 may be employed. It is also noted that the subject electrical connector not only interconnects the conductors on the surfaces of one or more printed circuit boards, but also provides a means of attaching mechanically and connecting electrical wires or component leads to the circuit conductors. More particularly, shaft 23 and head 24 (see FIGS. 3 through 6) provide a means for connecting an external wire or component lead to the electrical connector. Also, with reference to FIGS. 1 and 2, the hollow portion 16 could also be used to insert an external component or lead.

It is noted that in a standard riveted terminal the maximum tensile stress occurs at the outer edge of the formed mechanical rivet. Since this outer edge is a free edge, cracks can easily initiate at that surface and propagate inward. In the subject electrical connector, the outer surface of the deformed cone is not a free surface, and is much more resistant to crack initiation. The only free surface, if any, in the subject device is that at the center of the cone with the material after the formation is in compression. Therefore cracks cannot start at that point, thereby providing an extremely durable and competent electrical connection utilizing the subject electrical connector.

The embodiments of the invention in which an exclusive property or privilege is claimed are defined as follows:

1. An electrical connection for joining electrical conductors attached to the surfaces of a plurality of printed circuit boards arranged in a bundle and having top and bottom boards comprising:

a. at least a top and a bottom circuit board;

b. a hollow closed end cylindrical conductor for insertion into and through axial holes formed in said boards, said cylindrical conductor formed with a flange at one end for limiting against a top surface of the top board;

c. a deformable integral cone formed at the other end of the cylindrical conductor, the walls of which are deformed and spread over a portion of bottom surface of the bottom board.

2. An electrical connector as claimed in claim 1 wherein the axis of the cone is in alignment with the axis of the cylindrical conductor.

3. An electrical connector as claimed in claim 1 wherein the cone and part of the cylindrical conductor extend beyond the bottom surface of the bottom circuit board.

4. An electrical connector as claimed in claim 1 wherein the cone sub-tends a solid angle lying with the range of 80° to 100°.

5. An electrical connection for joining electrical conductors attached to the surfaces of a plurality of printed circuit boards arranged in a bundle and having top and bottom boards comprising:

a. at least a top and a bottom circuit board;

b. a hollow closed end cylindrical conductor for insertion into and through axial holes formed in said boards, said cylindrical conductor formed with a flange at one end for limiting against a top surface of the top board;

c. a deformable integral cone formed at the other end of the cylindrical conductor, the walls of which are deformed and spread over a portion of bottom surface of the bottom board; and d. a quantity of connecting solder dispersed around the outside surface of the cylindrical conductor and the conductors attached to the boards at the areas where the conductors adjoin the axial holes.

6. An electrical connection as claimed in claim 5 wherein said flange extends beyond the edges of the hole and wherein the bottom surface of the flange makes an angle of at least 5° with the surface of the adjoining top board surface, thereby forming an annular space for collection of solder.

7. An electrical connection as claimed in claim 5 wherein the axis of said deformable cone is in alignment with the axis of the cylindrical conductor.

8. An electrical connection as claimed in claim 5 wherein the cone and part of the cylindrical conductor extend beyond the bottom surface of the bottom circuit board.

9. An electrical connection as claimed in claim 5 wherein the cone subtends a solid angle lying within the range of 80° to 100°.

10. An electrical connection as claimed in claim 5 wherein the hollow cylindrical portion of the connector extends only part way within the cylindrical conductor.

11. An electrical connection as claimed in claim 5 wherein said hollow closed end cylindrical surface for achieving interference fit with the printed circuit boards.

* * * * *